United States Patent [19]

Tsukamoto

[11] Patent Number: 5,399,506
[45] Date of Patent: Mar. 21, 1995

[54] SEMICONDUCTOR FABRICATING PROCESS

[75] Inventor: Hironori Tsukamoto, Kanagawa, Japan

[73] Assignee: Sony Corporation, Tokyo, Japan

[21] Appl. No.: 248,596

[22] Filed: May 24, 1994

Related U.S. Application Data

[63] Continuation of Ser. No. 105,154, Aug. 12, 1993, abandoned.

[30] Foreign Application Priority Data

Aug. 13, 1992 [JP] Japan .................. 4-215325

[51] Int. Cl.⁶ ............................ H01L 21/268
[52] U.S. Cl. ........................ 437/19; 437/174; 437/934; 437/950
[58] Field of Search ............... 437/16, 19, 25, 173, 437/174, 247, 907, 908, 934, 942, 943, 950; 148/DIG. 3, DIG. 4, DIG. 90, DIG. 91, DIG. 92, DIG. 93, DIG. 127, DIG. 144

[56] References Cited

U.S. PATENT DOCUMENTS

| | | | |
|---|---|---|---|
| 4,151,008 | 4/1979 | Kirkpatrick | 437/942 |
| 4,331,485 | 5/1982 | Gat | 437/174 |
| 4,379,727 | 4/1983 | Hansen et al. | 437/19 |
| 4,646,426 | 3/1987 | Sasaki | 437/174 |

FOREIGN PATENT DOCUMENTS 1-187814  7/1989  Japan .................. 148/DIG. 90

OTHER PUBLICATIONS

Kwor et al., "Effect of Furnace Preanneal and Rapid Thermal Annealing on Arsenic Implanted Silicon", J. Electr. Soc.; Solid-State Science and Technology, May 1985, pp. 1201-1206.

Primary Examiner—Brian E. Hearn
Assistant Examiner—Chandra Chaudhari
Attorney, Agent, or Firm—Hill, Steadman & Simpson

[57] ABSTRACT

In order to reduce a junction leakage current and obtain a shallow junction, ion implantation to form a doped region, such as an active region of a transistor, is followed by a low-temperature annealing and pulsed laser irradiation. The annealing temperature and time of the low-temperature anneal are 600° C. and one hour, for example. The subsequent pulsed laser irradiation is performed by a XeCl laser, for example, with irradiation energy of 700 mJ/cm2, and a pulse width of 44 nsec. This process can reduce the leakage current by effectively removing points defects around the junction, and enables activation without increasing the depth of the junction.

15 Claims, 5 Drawing Sheets

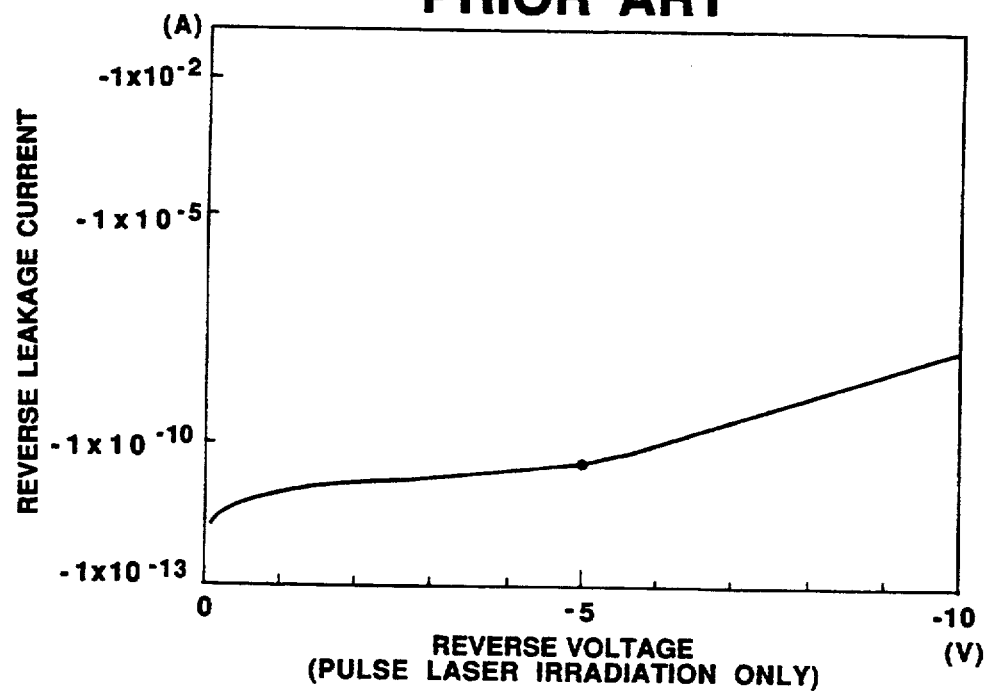
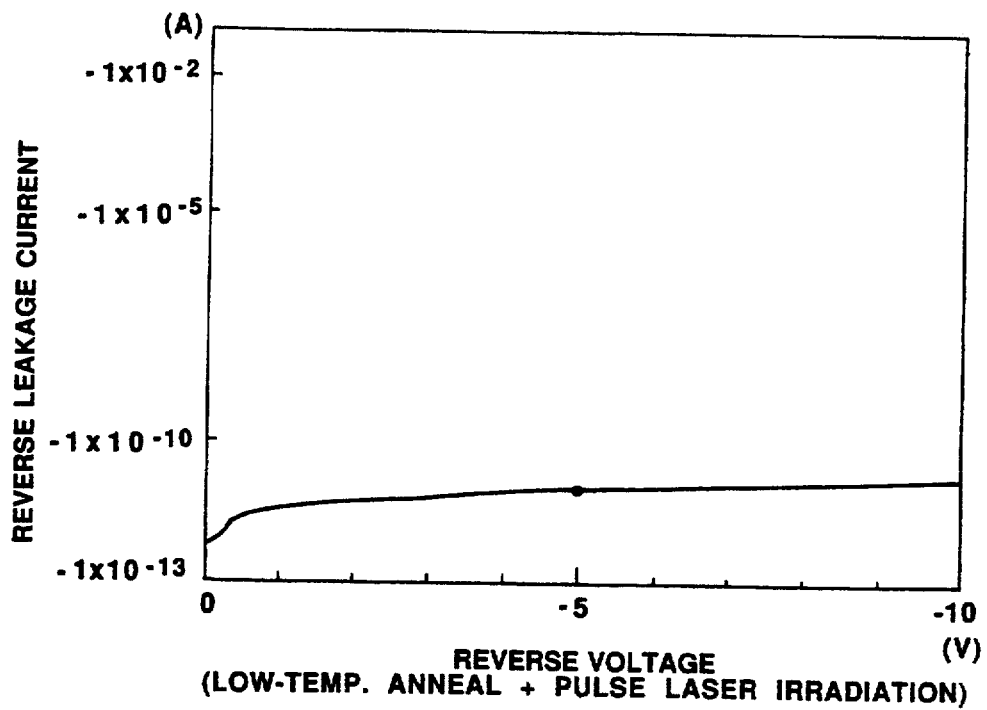

SEMICONDUCTOR FABRICATING PROCESS

This is a continuation of application Ser. No. 08/105,154, filed Aug. 12, 1993, now abandoned.

BACKGROUND OF THE INVENTION

The present invention relates to a process for fabricating semiconductor devices, and more specifically to a semiconductor fabricating process including one or more steps for recovering the crystal damage resulting from ion implantation, and activating carriers.

In semiconductor fabricating processes, various high temperature heat treatments are required to separate or interconnect a plurality of semiconductor devices which are formed in and on a single semiconductor substrate. Usually, ion implantation for forming a LDD (Lightly Doped Drain) structure, or source/drain regions usually results in crystal damage. In order to improve the crystallinity of a semiconductor substrate and to electrically activate implanted acceptor or donor ions, the ion implantation is followed by a step of activation annealing. Furthermore, in order to reduce a contact resistance, a silicide layer of compound consisting of Si and metal, such as refractory metal (W, Mo, Ti, etc.), Pt or Pd, requires a high temperature heating step. Conventional fabricating processes employ, as the activating anneal or high-temperature heat treatment, furnace annealing or rapid thermal annealing (RTA).

With advance in the IC technology, each IC component becomes smaller in size, and a shallower junction is required for source and drain regions, and emitter and base regions. The furnace annealing and rapid thermal annealing make the diffusion deeper, however, and these annealing methods cannot satisfy the demand for device miniaturization and higher packing density. During the activating anneal subsequent to the ion implantation, the diffusion proceeds not only vertically in the direction to deepen the source and drain diffusion regions, but also sideways so as to broaden the lateral dimension. This lateral diffusion tends to increase the possibility of punch-through specifically in a miniaturized MOS transistor having a short gate length. Annealing at a lower temperature can avoid these undesirable diffusion effects and keep shallow implants shallow. In this case, however, the resistivity remains high, the device's current handling characteristic becomes poor, and the transistor is unable to provide required switching performance.

The time required for rapid thermal annealing is not short enough. FIG. 3 shows one example in which the substrate is heated at about 1400° C. The rate of increase of temperature is 100° C./sec, and a rise of temperature takes a considerable time. The duration t during which the substrate is held at the peak temperature is equal to or more than one second, at least. The duration of the peak temperature is still too long to achieve a desired shallow source-drain junction structure in a minute transistor having a gate length (Lg) as short as 0.5~0.35 μm, for instance. Moreover, infrared radiation used in RTA is absorbed unevenly by SiO2 films on top of the substrate and other topside films having different infrared absorption characteristics.

Pulsed laser irradiation is another method which can be employed for the activating anneal to form a shallow doped region. The laser pulse energy is absorbed by the surface (about 20 nm) of the semiconductor substrate, so that the pulse laser annealing is possible only at a depth of about 100 nm or less, even if thermal diffusion is taken into account. The temperature increase of the wafer as a whole is very small (about 1°~2° C.). The pulsed laser annealing is, therefore, suitable for activation annealing to form a shallow LDD structure, or source-drain pair.

In the case of the pulse laser activation annealing, however, the time of heat treatment is very short (t=100 nsec, for instance) as shown by a profile of the substrate temperature during irradiation in FIG. 4. Therefore, it is not possible to clear a silicon substrate 1 of point defects 2 formed at levels deeper than the junction of an ion implanted region 1a, such as a source/-drain region. The remaining point defects cause an increase of leakage current given an application of reverse voltage. FIG. 6 shows a relationship between reverse voltage and reverse leakage current in a junction accompanied by such points defects 2. In the example of FIG. 6, only the pulse laser annealing is applied.

This problem can be solved by increasing the power of the laser to heat deeper regions in the substrate. However, this solution deepens and broadens the implant dopant profile as in the conventional furnace annealing or RTA. Furthermore, high energy laser pulses melt the semiconductor surface to a greater depth and damages the flatness or planarity of the semiconductor substrate surface. Low energy laser pulses melt only a very thin surface layer, and allows a flat surface to be immediately formed again.

SUMMARY OF THE INVENTION

It is, therefore, an object of the present invention to provide a semiconductor fabricating process which can form shallower, finer scale, junction structures and reduce junction leakage current.

According to the present invention, a fabricating process comprises an ion-implanting step for forming an ion implant layer (or region) in a semiconductor substrate by ion implantation; a low-temperature annealing step for annealing the semiconductor substrate; and an activating step for activating implanted ions in the ion implant layer by pulse laser irradiation onto the surface of the semiconductor substrate.

The low-temperature annealing step is effective for removing point defects deeper than the implant layer, so that the resulting structure can reduce the current generated by the point defects around the junction, and reduce the leak current. By the pulse laser irradiation, the shallow ion implant layer is activated and the shallow junction is maintained.

Preferably, the low-temperature annealing is performed in the temperature range of 550°~850° C. in which crystallization of amorphous silicon is possible. A more preferable range of the annealing temperature at the low-temperature annealing step is 600°~700° C. The annealing time is from 30 minutes to six hours, and more preferably 1~3 hours. A higher annealing temperature or a longer annealing time would result in a deeper junction.

In the activating step of pulse laser annealing, usable lasers are. A ruby laser (wavelength: 694 nm), XeF (wavelength: 351 nm), XeCl (wavelength: 308 nm), KrF (wavelength: 249 nm), and ArF (wavelength: 193 nm). Preferable lasers are a XeF laser and a XeCl laser. The wavelengths of these lasers are in a range in which the absorption coefficients of Si crystal and boron (B) ion implanted Si crystal become approximately equal to each other as shown in FIG. 8, so that the irradiation energy is absorbed equally. The irradiation energy of the pulse laser anneal ranges from 650 to 1100 mJ/cm². The preferable range is 700~900 mJ/cm². The preferable range of the pulse width is 20~100 nsec. The irradiation interval can be determined arbitrarily.

Crystalline silicon and amorphous silicon have high absorption coefficients with respect to short wavelength laser pulses. For example, the absorption coefficient is as high as $1.4 \times 10^6$ cm$^{-1}$ for XeCl (wavelength: 308 nm). The absorption coefficient is a factor (or parameter) representing a light intensity distribution, and is given by the following equation:

$$I = I_0 \exp(-\alpha x)$$

where I is the intensity of light, $I_0$ is the intensity of light incident on a surface of substance, $\alpha$ is the absorption coefficient (cm$^{-1}$), and x is a depth (cm). That is, the light intensity decays, at a depth of $1/\alpha$, to $1/e$ (about one third) of the intensity at the surface. In the case of XeCl, ⅔ of the radiation energy is absorbed up to a depth of 70 Å from the surface, and most is converted to heat. In this way, short wavelength pulsed laser irradiation makes it possible to heat only a very shallow layer in a semiconductor substrate.

BRIEF DESCRIPTION OF THE DRAWINGS

FIG. 6 is a graph showing a reverse leakage current at a junction, annealed only by pulsed laser irradiation.

FIG. 7 is a graph showing a reverse leakage current in the structure obtained by the process according to the first embodiment.

DETAILED DESCRIPTION OF THE INVENTION

Figure 1A:
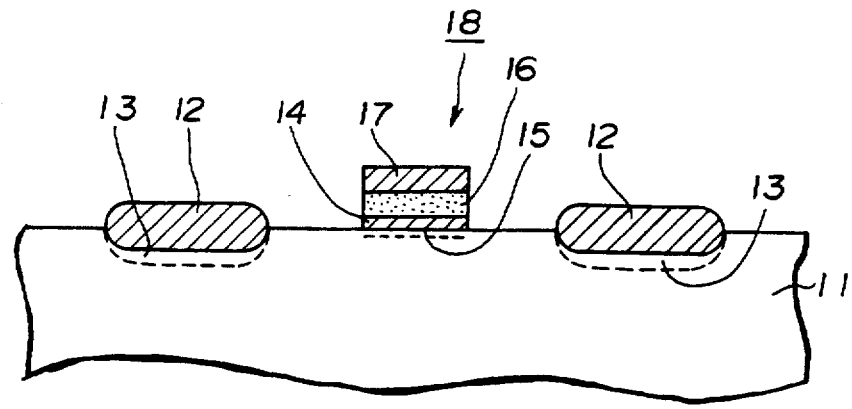
FIGS. 1A, 1B and 1C are sectional views for showing a MOS fabricating process according to a first embodiment of the present invention.
Figure 1B:
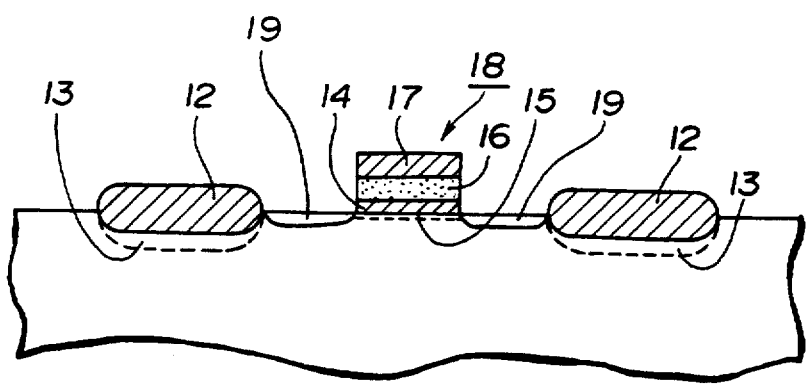
Figure 1C:
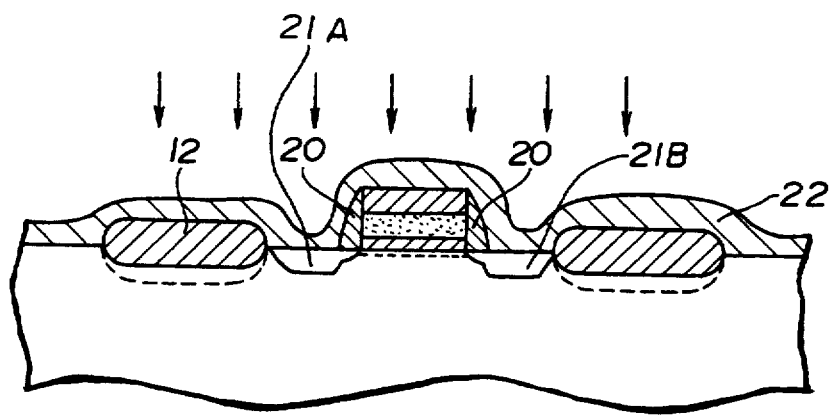

FIGS. 1A~1C show a fabricating process according to a first embodiment in which the invention is applied to a MOS transistor fabricating process.

First, a known method is used to form at least one isolation structure of an isolation layer 12 formed on a silicon substrate 11, and a channel stop ion implant layer 13 formed underneath the isolation layer 12. Then, a gate oxide film 14 is formed, and thereafter a threshold voltage adjusting ion implant layer 15 is formed. Then, the gate oxide layer 14 is covered with a gate polysilicon layer 16, and a silicide layer 17 is formed on the gate polysilicon layer 16. The silicide of the layer 17 is an intermetallic compound of metal and silicon. Then, the silicide layer 17, the gate polysilicon layer 16 and the gate oxide film 14 are patterned to form an insulated gate electrode structure (or region) 18, as shown in FIG. 1A.

A next step is for forming LDD (Lightly Doped Drain-source) regions 19 by ion implantation, as shown in FIG. 1B. Then, furnace annealing or rapid thermal annealing (RTA) is performed to activate the various conductive layers and underlying layers formed in the preceding steps, to lower the resistance of the silicide layer 17, and to obtain a Gaussian distribution of the impurity in the LDD regions 19. This example employs the rapid thermal annealing for 10 seconds at 1050° C.

Subsequently, at least one side wall spacer 20 is formed, by a known method, on the side wall of the gate electrode. Then, ion implantation is performed to a source region 21A and a drain region 21B. In this ion implantation step, it is possible to employ the following implantation conditions, for example. The implantation energy is 5~20 keV and the dose is $1 \times 10^{15} \sim 3 \times 10^{15}$/cm² in the case of arsenic ions (As$^+$). The implantation energy is 5~20 keV and the dose is $1 \times 10^{15} \sim 3 \times 10^{15}$/cm² in the case of BF$_2^+$ ions.

Then, an oxide film 22 is formed to a film thickness of 50 nm, as an anti-reflection film, according to the need, by chemical vapor deposition (CVD).

Then, a low-temperature annealing is performed at 600° C. In this example, this low-temperature annealing step is a 600° C. (electric) furnace anneal.

After the low-temperature anneal, the ions implanted into the source region 21A and the drain region 21B are activated by irradiation of pulsed laser light upon the silicon substrate, as shown in FIG. 1C. In this example, the conditions of this activating anneal using the pulse laser are as follows: The laser used is a XeCl laser; the irradiation energy is 700 mJ/cm²; and the pulse width is 44 nsec.

Subsequently, the semiconductor device is completed by process steps which are known per se. In these subsequent steps, it is important to limit the temperature of heat treatment of the semiconductor device to 600° C. The semiconductor device undergoes only heat treatments at temperatures equal to or lower than 600° C.

In this embodiment, the point defects formed by the ion bombardment into the source region 21A and the drain region 21B are effectively removed at temperatures equal to or lower than the activating anneal temperature, and the implanted impurity particles barely diffuse at annealing temperatures of 600°~700° C. Therefore, the low-temperature annealing step can effectively reduce the point defects without deepening the junction. The combination of the low-temperature annealing and the pulse laser irradiation can restrain the reverse leakage current as shown in FIG. 7. The activation of the source and drain regions 21A and 21B is achieved by the pulse laser irradiation, so that the shallow junction structure can be maintained. The fabricating process of the invention makes it possible to fabricate very high speed integrated circuit devices constituted by miniature transistors.

Figure 2:
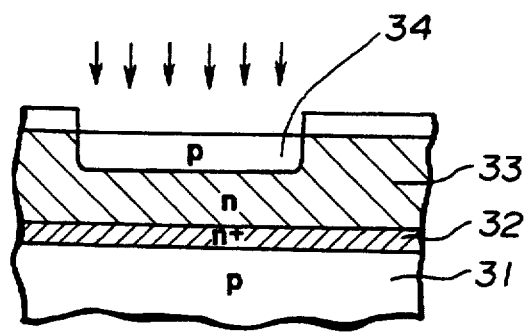
FIGS. 2A and 2B are sectional views for showing a bipolar fabricating process according to a second embodiment of the present invention.
Figure 2:
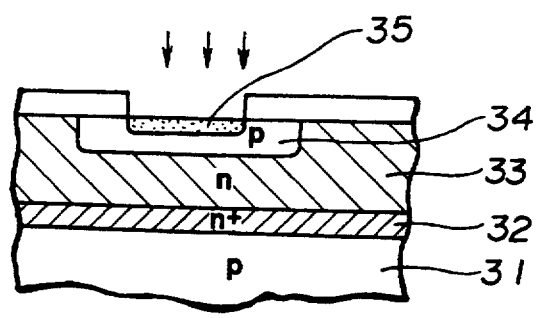
Figure 3:
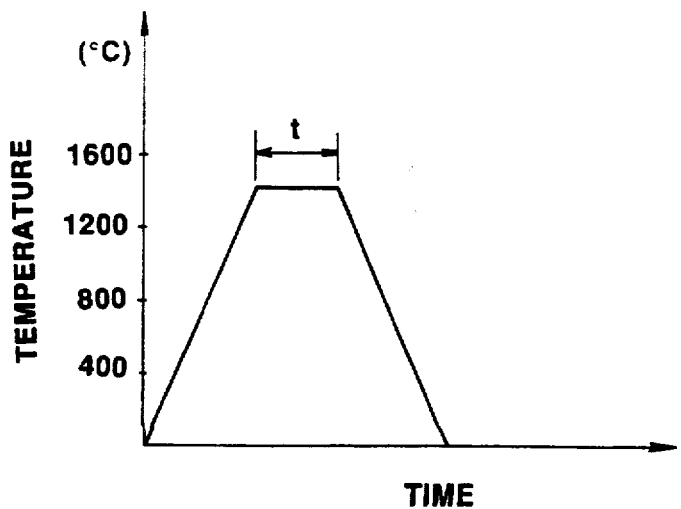
FIG. 3 is a graph showing variation of the temperature of a substrate during rapid thermal annealing.
Figure 4:
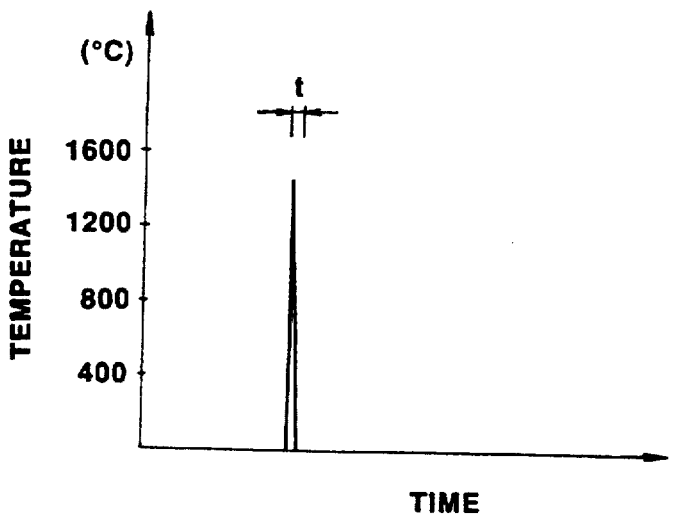
FIG. 4 is a graph showing variation of the temperature of a substrate during pulsed laser annealing.
Figure 5:
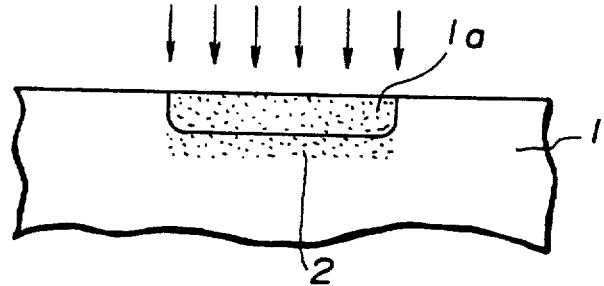
FIG. 5 is a sectional view illustrating points defects produced by ion bombardment.
Figure 8:
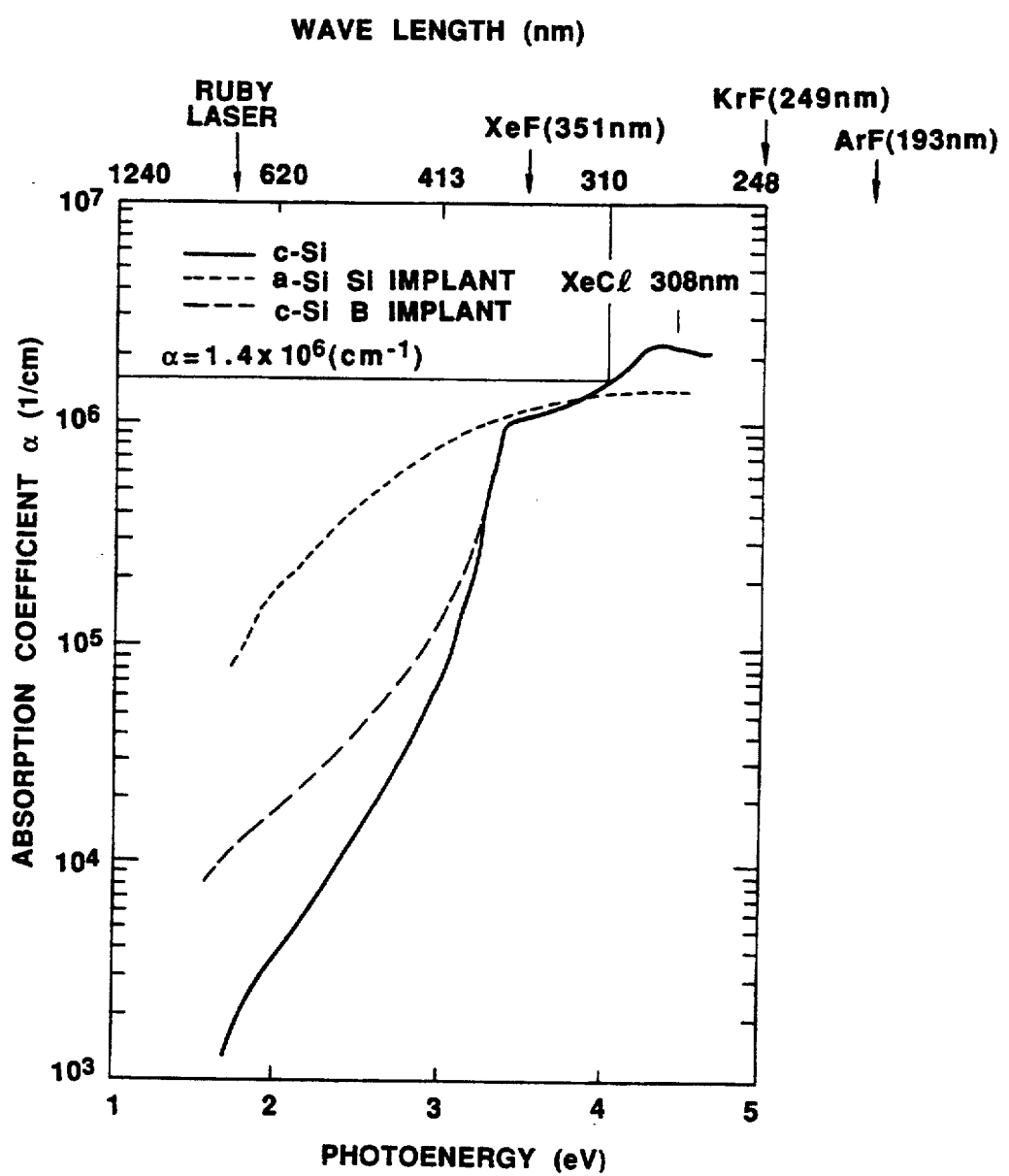
FIGS. 8 is a graph for showing absorption coefficients for different laser pulses which can be employed in the embodiments of the present invention. An upper horizontal axis indicates the wavelength (nm), and a lower horizontal axis indicates the photoenergy (or photon energy)(eV).

FIGS. 2A and 2B shows a fabricating process according to a second embodiment of the present invention. The process of the second embodiment is for a bipolar transistor.

First, a buried layer 32 is formed between a substrate 31 and an epitaxial layer 33 by known process steps. In this example, the buried layer 32 is formed in the P-type silicon substrate 31 by diffusion of arsenic (As), and then the n-type overlying layer 33 is formed by epitaxial growth. Thereafter, the epitaxial layer 33 is selectively oxidized to form isolation wall (not shown), and then a base region (or layer) 34 is formed by ion implantation of boron (B).

The next step is a known step to form an emitter region (or layer) 35 which is a shallow ion implant layer. Then a low-temperature anneal follows to reduce point defects formed by ion bombardment.

Next to the low-temperate anneal, pulsed laser beam is irradiated onto the top surface of the device to activate the emitter region 35. In the pulse laser activating annealing step of this example, the laser is a XeCl, the irradiation energy is 700 mJ/cm$^2$, and the pulse width is 44 nsec.

In the second embodiment, the step of low-temperature annealing can remove the point defects formed by ion implantation to the emitter region 35, and the step of pulse laser irradiation can activate the emitter region 35 while maintaining the shallow junction. In this embodiment, the pulse laser irradiation is used to activate the emitter region 35. It is, however, possible to use the pulse laser irradiation for activation of the base region 34.

Although various minor changes and modifications might be suggested by those skilled in this art, it will be apparent that I wish to include within the claims of the patent warranted hereon all such changes and modifications as reasonably come within my contribution to the art.

What is claimed is:

1. A semiconductor device fabricating process, comprising the steps of:
   ion-implanting impurity ions into a semiconductor substrate to form a shallow ion implant layer in a surface region of the semiconductor substrate;
   annealing the semiconductor substrate by heating the semiconductor substrate which has the shallow ion implant layer to a temperature of 550° C. to 850° C. to reduce point defects but without deepening the shallow ion implant layer;
   radiating a pulsed laser on the semiconductor substrate to activate the implanted ions of the shallow ion implant layer while maintaining the depth of the shallow ion implant layer; and performing said radiating step by a laser beam having an energy density in a range of 650 to 1100 mJ/cm$^2$.

2. A semiconductor device fabricating process according to claim 1 wherein said ion implantation comprises forming an active region of a transistor.

3. A semiconductor device fabricating process according to claim 2 wherein said ion implantation includes forming source and drain regions of a field effect transistor.

4. A semiconductor device fabricating process according to claim 3 further comprising a doping step for forming a lightly doped region by ion implantation in the semiconductor substrate before the ion implanting step; and an annealing step for annealing the semiconductor substrate by one of furnace annealing and rapid thermal annealing to form a Gaussian distribution of impurity ions in the lightly doped region.

5. A semiconductor device fabricating process according to claim 4 wherein said process further comprises forming an anti-reflection film between said ion implantation of said implant layer and said low temperature annealing.

6. A semiconductor device fabricating process according to claim 5 wherein said anti-reflection film is an oxide film formed by chemical vapor deposition.

7. A semiconductor device fabricating process according to claim 4 wherein said process further comprises forming a polysilicon gate structure before said doping ion implantation.

8. A semiconductor device fabricating process according to claim 2 wherein said ion implantation includes forming one of an emitter region and a base region of a bipolar transistor.

9. A semiconductor device fabricating process according to claim 8 wherein said process further comprises a base doping for forming said base region extending into said substrate from said surface of said substrate, and said ion implantation includes forming said emitter region in said base region, said emitter region formed by said ion implantation being shallower from said surface of said substrate than said base region.

10. A semiconductor device fabricating process according to claim 9 wherein said process further comprises forming said substrate which is an epitaxial substrate comprising an original substrate layer, an epitaxial layer grown on said original substrate layer and a buried layer formed between said original substrate layer and said epitaxial layer, said base and emitter regions being formed in said epitaxial layer.

11. A semiconductor device fabricating process according to claim 1 wherein said activating of the implanted ions is achieved by irradiation of the pulsed laser radiation of a wavelength at which a photon absorption coefficient of said semiconductor substrate is greater than $1 \times 10^6$ cm$^{-1}$, with irradiation energy in a range from 650 to 1100 mJ/cm$^2$.

12. A semiconductor device fabricating process according to claim 11 wherein the irradiation of the pulsed laser radiation of said activating of the implanted ions is performed by using one of a ruby laser, a XeF laser, a XeCl laser, a KrF laser and an ArF laser.

13. A semiconductor device fabricating process according to claim 1 wherein said annealing temperature is in a range of 600° C. to 700° C.

14. A semiconductor device fabricating process as claimed in claim 1 wherein a pulse width of the laser beam is in a range of 20 to 100 nsec.

15. A semiconductor device fabricating process according to claim 1 wherein said annealing is carried out for a duration of 30 minutes to 6 hours.

* * * * *